US011061090B2

(12) United States Patent
Fukushima et al.

(10) Patent No.: US 11,061,090 B2
(45) Date of Patent: Jul. 13, 2021

(54) MAGNETIC RESONANCE IMAGING APPARATUS AND RF COIL

(71) Applicant: CANON MEDICAL SYSTEMS CORPORATION, Otawara (JP)

(72) Inventors: Masahiro Fukushima, Utsunomiya (JP); Sadanori Tomiha, Nasushiobara (JP); Manabu Ishii, Otawara (JP); Satoshi Imai, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 73 days.

(21) Appl. No.: 16/181,772

(22) Filed: Nov. 6, 2018

(65) Prior Publication Data

US 2019/0137579 A1    May 9, 2019

(30) Foreign Application Priority Data

Nov. 8, 2017 (JP) .............................. JP2017-215820
Nov. 2, 2018 (JP) .............................. JP2018-207396

(51) Int. Cl.
*G01R 33/34* (2006.01)
*G01R 33/422* (2006.01)
*G01R 33/385* (2006.01)

(52) U.S. Cl.
CPC . *G01R 33/34076* (2013.01); *G01R 33/34007* (2013.01); *G01R 33/422* (2013.01); *G01R 33/3858* (2013.01)

(58) Field of Classification Search
None
See application file for complete search history.

(56) References Cited

U.S. PATENT DOCUMENTS 5,617,026 A * 4/1997 Yoshino ................ F16F 15/005
                                                              324/318
6,100,694 A * 8/2000 Wong ............... G01R 33/34046
                                                              324/318
(Continued)

FOREIGN PATENT DOCUMENTS

JP          2000-166895          6/2000

OTHER PUBLICATIONS

Hayes et al, An Efficient, Highly Homogeneous Radiofrequency Coil for Whole-body NMR Imaging at 1.5 T, Mar. 18, 1985, Journal Of Magnetic Resonance 63, 622-628 (Year: 1985).*

(Continued)

*Primary Examiner* — Jermele M Hollington
(74) *Attorney, Agent, or Firm* — Oblon, McClelland, Maier & Neustadt, L.L.P.

(57) ABSTRACT

A magnetic resonance imaging apparatus according to an embodiment includes a Radio Frequency (RF) coil configured to apply an RF magnetic field to a subject. The RF coil includes: a supporting member formed to have a circular cylindrical shape; and an electrically-conductive member which is arranged to extend along an axial direction of the supporting member and through which a radio frequency current flows when the RF magnetic field is generated. The electrically-conductive member includes: a first part provided on an outer circumferential surface of the supporting member; and a second part positioned farther away from an RF shield provided on an outer circumferential side of the RF coil than the first part is, in terms of a radial direction of the supporting member.

13 Claims, 6 Drawing Sheets

(56) References Cited

U.S. PATENT DOCUMENTS

| | | | |
|---|---|---|---|
| 6,297,636 B1 | 10/2001 | Shimo et al. | |
| 9,880,239 B2* | 1/2018 | Tomiha | G01R 33/34092 |
| 9,983,279 B2* | 5/2018 | Leussler | G01R 33/34076 |
| 10,185,000 B2* | 1/2019 | Hoile | G01R 33/5659 |
| 10,473,737 B2* | 11/2019 | Connell | G01R 33/3692 |
| 10,534,049 B2* | 1/2020 | Leussler | A61B 5/055 |
| 10,705,167 B2* | 7/2020 | Lips | G01R 33/3453 |
| 2007/0262777 A1 | 11/2007 | Warntjes et al. | |
| 2008/0061785 A1* | 3/2008 | Soutome | G01R 33/34076 |
| | | | 324/319 |
| 2012/0086452 A1* | 4/2012 | Dohata | G01R 33/3456 |
| | | | 324/318 |
| 2012/0212225 A9 | 8/2012 | Iwama et al. | |
| 2014/0055136 A1* | 2/2014 | Leussler | G01R 33/3415 |
| | | | 324/309 |
| 2014/0061202 A1* | 3/2014 | Mathieu | G01R 33/3804 |
| | | | 220/560.09 |
| 2014/0247050 A1* | 9/2014 | Tomiha | G01R 33/34092 |
| | | | 324/322 |
| 2016/0216344 A1* | 7/2016 | Habara | G01R 33/34007 |
| 2018/0299521 A1* | 10/2018 | Leussler | A61B 5/055 |
| 2019/0154775 A1* | 5/2019 | Stack | G01R 33/34084 |
| 2019/0257901 A1* | 8/2019 | Tanaka | G01R 33/385 |
| 2019/0317166 A1* | 10/2019 | Imai | G01R 33/34076 |
| 2020/0341083 A1* | 10/2020 | Ohishi | A61B 5/055 |
| 2021/0068703 A1* | 3/2021 | Fukushima | A61B 5/4595 |

OTHER PUBLICATIONS

Vaughan et al, Detunable Transverse Electromagnetic (TEM) Volume Coil for High-Field NMR, 2002, Magnetic Resonance in Medicine 47, 990-1000 (Year: 2002).*

* cited by examiner

MAGNETIC RESONANCE IMAGING APPARATUS AND RF COIL

CROSS-REFERENCE TO RELATED APPLICATIONS

This application is based upon and claims the benefit of priority from Japanese Patent Application No. 2017-215820, filed on Nov. 8, 2017; and Japanese Patent Application No. 2018-207396, filed on Nov. 2, 2018, the entire contents of which are incorporated herein by reference.

FIELD

Embodiments described herein relate generally to a magnetic resonance imaging apparatus and a Radio Frequency (RF) coil.

BACKGROUND

Magnetic Resonance Imaging (MRI) apparatuses are apparatuses configured to apply a Radio Frequency (RF) magnetic field to a subject placed in a static magnetic field and to generate various types of MR images on the basis of MR signals emitted from the subject due to an influence of the RF magnetic field. Those MRI apparatuses each include an RF coil used for applying the RF magnetic field to the subject.

DETAILED DESCRIPTION

A magnetic resonance imaging apparatus according to an embodiment includes an RF coil configured to apply an RF magnetic field to a subject. The RF coil includes: a supporting member formed to have a circular cylindrical shape; and an electrically-conductive member which is arranged to extend along an axial direction of the supporting member and through which a radio frequency current flows when the RF magnetic field is generated, and the electrically-conductive member includes: a first part provided on an outer circumferential surface of the supporting member; and a second part positioned farther away from an RF shield provided on an outer circumferential side of the RF coil than the first part is, in terms of a radial direction of the supporting member.

Exemplary embodiments of a Magnetic Resonance Imaging (MRI) apparatus and an RF coil will be explained in detail below, with reference to the accompanying drawings.

EMBODIMENTS

Figure 1:
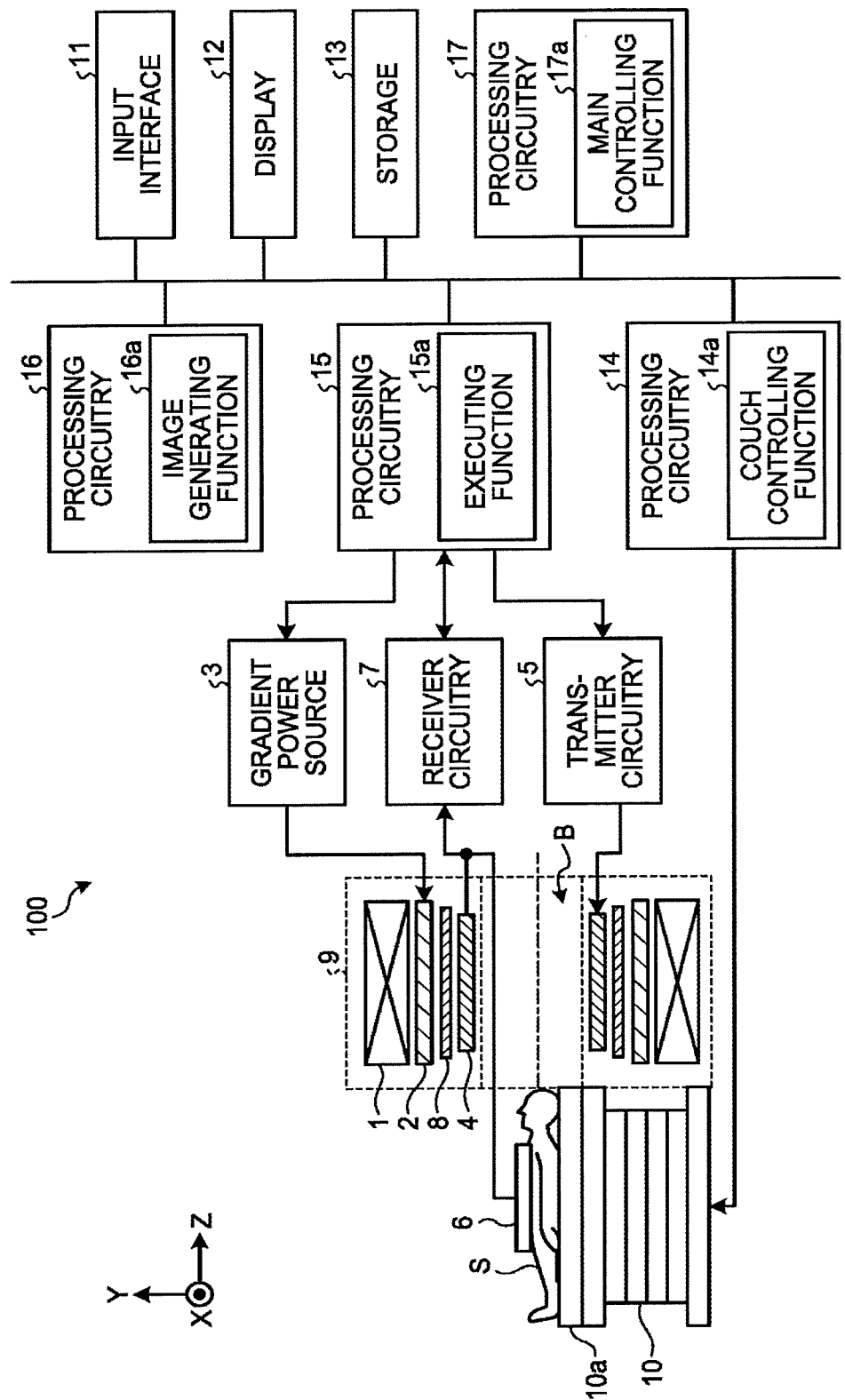
FIG. 1 is a diagram illustrating a configuration of a magnetic resonance imaging apparatus according to an embodiment described herein.

FIG. 1 is a diagram illustrating a configuration of an MRI apparatus 100 according to an embodiment. For example, as illustrated in FIG. 1, the MRI apparatus 100 according to the present embodiment includes a magnet 1, a gradient coil 2, a gradient power source 3, a whole body RF coil 4, transmitter circuitry 5, a local RF coil 6, receiver circuitry 7, an RF shield 8, a gantry 9, a couch 10, an input interface 11, a display device 12, a storage 13, and pieces of processing circuitry 14 to 17.

The magnet 1 is configured to generate a static magnetic field in an image taking space in which a subject S is placed. More specifically, the magnet 1 is formed to have a hollow and substantially circular cylindrical shape (which may have an oval cross-section orthogonal to the central axis thereof) and is configured to generate the static magnetic field in the space on the inside of the circular cylinder. For example, the magnet 1 includes a cooling container formed to have a substantially circular cylindrical shape and a magnet such as a superconductive magnet that is immersed in a cooling member (e.g., liquid helium) filling the cooling container. In this situation, for example, the magnet 1 may be configured to generate the static magnetic field by using a permanent magnet.

The gradient coil 2 is disposed on the inside of the magnet 1 and is configured to apply a gradient magnetic field to the image taking space in which the subject S is placed. More specifically, the gradient coil 2 is formed to have a hollow and substantially circular cylindrical shape (which may have an oval cross-section orthogonal to the central axis thereof) and is configured to generate gradient magnetic fields along X-, Y-, and Z-axes that are orthogonal to one another in the space on the inside of the circular cylinder. In this situation, the X-axis, the Y-axis, and the Z-axis structure an apparatus coordinate system unique to the MRI apparatus 100. For example, the Z-axis is set so as to coincide with the axis of the circular cylinder of the gradient coil 2 and to extend along a magnetic flux in the static magnetic field generated by the magnet 1. Further, the X-axis is set to extend along the horizontal direction orthogonal to the Z-axis. The Y-axis is set to extend along the vertical direction orthogonal to the Z-axis.

By supplying an electric current to the gradient coil 2, the gradient power source 3 is configured to cause the gradient magnetic field to be generated along each of the X-, Y-, and Z-axes, in the space formed inside the gradient coil 2. By generating the gradient magnetic fields along the X-, Y-, and Z-axes in this manner, the gradient power source 3 is able to cause the gradient magnetic fields to be generated along a read-out direction, a phase-encoding direction, and a slice direction, respectively. The axes extending along the read-out direction, the phase-encoding direction, and the slice direction structure a logical coordinate system used for defining slice regions or a volume region serving as a target of an image taking process. In the following sections, the gradient magnetic field generated along the read-out direction will be referred to as a read-out gradient magnetic field; the gradient magnetic field generated along the phase-encoding direction will be referred to as a phase-encoding gradient magnetic field; and the gradient magnetic field generated along the slice direction will be referred to as a slice gradient magnetic field.

The gradient magnetic fields are superimposed on the static magnetic field generated by the magnet 1 and are used for appending spatial position information to magnetic resonance (MR) signals. More specifically, the read-out gradient magnetic field appends position information along the read-out direction to an MR signal, by varying the frequency of the MR signal in accordance with the position in the read-out direction. Further, the phase-encoding gradient magnetic field appends position information in the phase-encoding direction to an MR signal, by varying the phase of the MR signal along the phase-encoding direction. Further, when an image taking region is represented by slice regions, the slice gradient magnetic field is used for determining the orientations, the thicknesses, and the quantity of the slice regions. In contrast, when an image taking region is represented by a volume region, the slice gradient magnetic field appends position information along the slice direction to an MR signal, by varying the phase of the MR signal in accordance with the position in the slice direction.

The whole body RF coil 4 is arranged on the inside of the gradient coil 2 and is configured to apply a Radio Frequency (RF) magnetic field to the image taking space in which the subject S is placed and to receive the MR signals emitted from the subject S due to an influence of the RF magnetic field. More specifically, the whole body RF coil 4 is formed to have a hollow and substantially circular cylindrical shape (which may have an oval cross-section orthogonal to the central axis thereof) and is configured to apply the RF magnetic field to the space on the inside of the circular cylinder. Further, the whole body RF coil 4 is configured to receive the MR signals emitted from the subject S and to output the received MR signals to the receiver circuitry 7.

The transmitter circuitry 5 is configured to output an RF pulse signal corresponding to a Larmor frequency to the whole body RF coil 4. More specifically, the transmitter circuitry 5 includes oscillation circuitry, phase selecting circuitry, frequency converting circuitry, amplitude modulating circuitry, and radio frequency amplifying circuitry. The oscillation circuitry is configured to generate a radio frequency pulse having a resonant frequency unique to a target atomic nucleus placed in the static magnetic field. The phase selecting circuitry is configured to select a phase of the radio frequency pulse output from the oscillation circuitry. The frequency converting circuitry is configured to convert the frequency of the radio frequency pulse output from the phase selecting circuitry. The amplitude modulating circuitry is configured to modulate the amplitude of the radio frequency pulse output from the frequency converting circuitry according to, for example, a sinc function. The radio frequency amplifying circuitry is configured to amplify the radio frequency pulse output from the amplitude modulating circuitry and to output the amplified radio frequency pulse to the whole body RF coil 4.

The local RF coil 6 is configured to receive the MR signals emitted from the subject S. More specifically, the local RF coil 6 is attached to the subject S placed on the inside of the whole body RF coil 4 and is configured to receive the MR signals emitted from the subject S due to the influence of the RF magnetic field applied by the whole body RF coil 4 and to output the received MR signals to the receiver circuitry 7. For example, the local RF coil 6 is a reception coil prepared for any of various sites serving as targets of image taking processes. Examples of the local RF coil 6 include a reception coil for the head, a reception coil for the neck, a reception coil for a shoulder, a reception coil for the chest, a reception coil for the abdomen, a reception coil for a leg, and a reception coil for the spine. In addition, the local RF coil 6 may further have a transmitting function of applying an RF magnetic field. In that situation, the local RF coil 6 is connected to the transmitter circuitry 5 and is configured to apply the RF magnetic field to the subject S, on the basis of the RF pulse signal output from the transmitter circuitry 5.

The receiver circuitry 7 is configured to generate MR signal data on the basis of the MR signals output from either the whole body RF coil 4 or the local RF coil 6 and to output the generated MR signal data to the processing circuitry 15. For example, the receiver circuitry 7 includes selecting circuitry, pre-amplifying circuitry, phase detecting circuitry, and analog/digital converting circuitry. The selecting circuitry is configured to selectively receive an input of the MR signals output from either the whole body RF coil 4 or the local RF coil 6. The pre-amplifying circuitry is configured to amplify the MR signals output from the selecting circuitry. The phase detecting circuitry is configured to detect the phase of the MR signals output from the pre-amplifying circuitry. The analog/digital converting circuitry is configured to generate the MR signal data by converting the analog signal output from the phase detecting circuitry into a digital signal and to output the generated MR signal data to the processing circuitry 15.

The RF shield 8 is, for example, disposed between the gradient coil 2 and the whole body RF coil 4 and is configured to block the RF magnetic field generated by the whole body RF coil 4. For example, the RF shield 8 is formed to have a hollow and substantially circular cylindrical shape (which may have an oval cross-section orthogonal to the central axis thereof) and is disposed in the space formed on the inner circumferential side of the gradient coil 2 so as to cover the outer circumferential surface of the whole body RF coil 4.

The gantry 9 houses therein the magnet 1, the gradient coil 2, and the whole body RF coil 4. More specifically, the gantry 9 has a bore B that is hollow and is formed to have a circular cylindrical shape. The gantry 9 houses therein the magnet 1, the gradient coil 2, the whole body RF coil 4, and the RF shield 8 that are disposed so as to surround the bore B. In this situation, the space formed on the inside of the bore B of the gantry 9 serves as the image taking space in which the subject S is placed when an image taking process is performed on the subject S.

The couch 10 includes a couchtop 10*a* on which the subject S is placed. When an image taking process is performed on the subject S, the couchtop 10*a* is inserted to the inside of the bore B of the gantry 9. For example, the couch 10 is installed in such a manner that the longitudinal direction thereof extends parallel to the central axis of the magnet 1.

The input interface 11 is configured to receive operations to input various types of instructions and various types of information from the operator. More specifically, the input interface 11 is connected to the processing circuitry 17 and is configured to convert the input operations received from the operator into electrical signals and to output the electrical signals to controlling circuitry. For example, the input interface 11 is realized by using a trackball, a switch button, a mouse, a keyboard, a touchpad on which an input operation can be performed by touching the operation screen thereof, a touch screen in which a display screen and a touchpad are integrally formed, a contactless input interface using an optical sensor, an audio input interface, and/or the like that are used for setting an image taking condition, a Region of Interest (ROI), and the like. In the present disclosure, the input interface 11 does not necessarily have to include one or more physical operational component parts such as a mouse, a keyboard, and/or the like. Examples of the input interface 11 include, for instance, electrical signal processing circuitry configured to receive an electrical signal corresponding to an input operation from an external input device provided separately from the apparatus and to output the electrical signal to the controlling circuitry.

The display device 12 is configured to display various types of information and various types of images. More specifically, the display device 12 is connected to the processing circuitry 17 and is configured to convert data of the various types of information and the various types of images sent thereto from the processing circuitry 17 into display-purpose electrical signals and to output the display-purpose electrical signals. For example, the display device 12 may be realized by using a liquid crystal monitor, a Cathode Ray Tube (CRT) monitor, a touch panel, or the like.

The storage 13 is configured to store therein various types of data. More specifically, the storage 13 is configured to store therein the MR signal data and image data. For example, the storage 13 is realized by using a semiconductor memory element such as a Random Access Memory (RAM), a flash memory, or the like, or a hard disk, an optical disk, or the like.

The processing circuitry 14 includes a couch controlling function 14a. The couch controlling function 14a is connected to the couch 10 and is configured to control operations of the couch 10 by outputting controlling-purpose electrical signals to the couch 10. For example, the couch controlling function 14a receives, via the input interface 11, an instruction from the operator indicating that the couchtop 10a should be moved in a longitudinal direction, an up-and-down direction, or a left-and-right direction, and further operates a driving mechanism for the couchtop 10a included in the couch 10 so as to move the couchtop 10a according to the received instruction.

The processing circuitry 15 includes an executing function 15a. The executing function 15a is configured to execute various types of pulse sequences by driving the gradient power source 3, the transmitter circuitry 5, and the receiver circuitry 7 on the basis of sequence execution data output from the processing circuitry 17. For example, the executing function 15a is configured to drive the gradient power source 3, the transmitter circuitry 5, and the receiver circuitry 7, by transmitting input signals each to the gradient power source 3, the transmitter circuitry 5, and the receiver circuitry 7.

In this situation, the sequence execution data is information that defines a pulse sequence indicating a procedure performed to acquire the MR signal data. More specifically, the sequence execution data is information that defines: the timing with which the electric current is to be supplied from the gradient power source 3 to the gradient coil 2 and the intensity of the electric current to be supplied; the intensity of the RF pulse signal to be supplied from the transmitter circuitry 5 to the whole body RF coil 4 and the timing with which the RF pulse signal is to be supplied; the detection timing with which the MR signals are to be detected by the receiver circuitry 7, and the like.

Further, as a result of executing the various types of pulse sequences, the executing function 15a is configured to receive the MR signal data from the receiver circuitry 7 and to store the received MR signal data into the storage 13. In this situation, a set made up of pieces of MR signal data received by the executing function 15a is stored in the storage 13 as data structuring a k-space as a result of being arranged two-dimensionally or three-dimensionally according to the position information appended by the read-out gradient magnetic field, the phase-encoding gradient magnetic field, and the slice gradient magnetic field described above.

The processing circuitry 16 includes an image generating function 16a. The image generating function 16a is configured to generate an image on the basis of the MR signal data stored in the storage 13. More specifically, the image generating function 16a generates the image by reading the MR signal data stored in the storage 13 by the executing function 15a and further performing a reconstructing process such as a post-processing process (i.e., a Fourier transform or the like) on the read MR signal data. Further, the image generating function 16a stores image data of the generated image into the storage 13.

The processing circuitry 17 includes a main controlling function 17a. The main controlling function 17a is configured to exercise overall control of the MRI apparatus 100, by controlling constituent elements of the MRI apparatus 100. For example, the main controlling function 17a receives, from the operator, an input of an image taking condition via the input interface 11. Further, the main controlling function 17a generates sequence execution data on the basis of each of the received image taking conditions and executes various types of pulse sequences by transmitting the generated sequence execution data to the processing circuitry 15. Further, for example, the main controlling function 17a reads any of the image data from the storage 13 in response to a request from the operator and outputs the read image data to the display device 12.

In this situation, for example, the pieces of processing circuitry described above are each realized by using a processor. In that situation, for example, the processing functions of the pieces of processing circuitry are stored in the storage 13 in the form of computer-executable programs. The pieces of processing circuitry are configured to realize the functions corresponding to the programs, by reading and executing the programs from the storage 13. In other words, each of the pieces of processing circuitry that has read the corresponding program has the pertained one of the functions illustrated within the pieces of processing circuitry in FIG. 1.

Further, the pieces of processing circuitry may be structured by combining together a plurality of independent processors, so that the functions thereof are realized as a result of the processors executing the programs. Further, the functions of the pieces of processing circuitry may be realized as being integrated into a single piece of processing circuitry or being distributed among a plurality of pieces of processing circuitry, as appropriate. Further, the functions of any of the pieces of processing circuitry may be realized by using a combination of hardware such as one or more circuits and software.

An overall configuration of the MRI apparatus 100 according to the present embodiment has thus been explained. The MRI apparatus 100 according to the present embodiment configured in this manner includes, as mentioned above, the whole body RF coil 4 configured to apply the RF magnetic field to the subject S and the RF shield 8 configured to block the RF magnetic field generated by the whole body RF coil 4.

Figure 2:
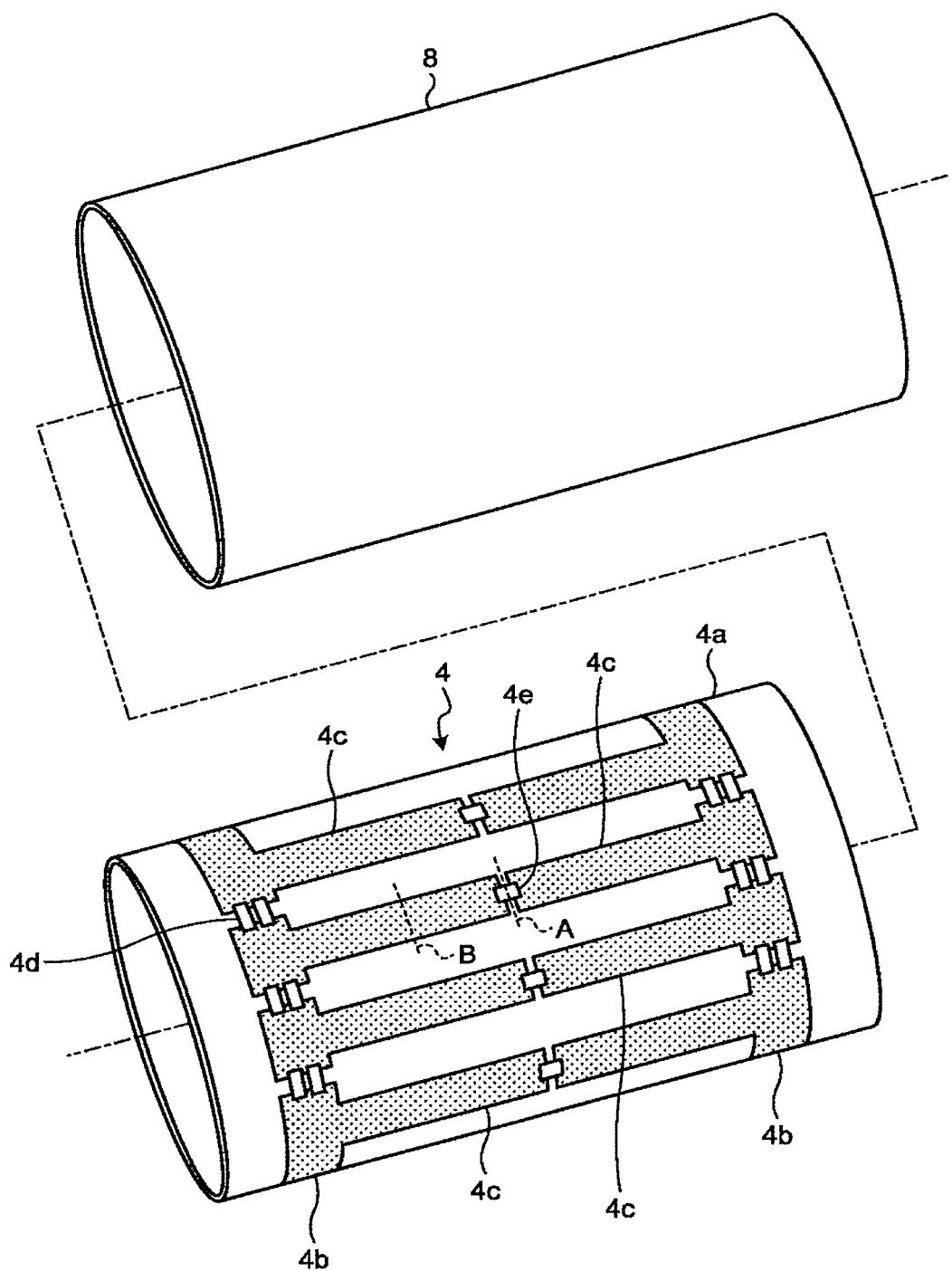
FIG. 2 is a perspective view illustrating an RF shield and a whole body RF coil according to the embodiment.

FIG. 2 is a perspective view illustrating the RF shield 8 and the whole body RF coil 4 according to the present embodiment. For example, as illustrated in the top section of FIG. 2, the RF shield 8 is formed to have a substantially circular cylindrical shape (which may have an oval cross-section orthogonal to the central axis thereof) and is disposed so as to cover the outer circumferential surface of the whole body RF coil 4. In this situation, the RF shield 8 is formed by using an electrically-conductive material and is configured to attenuate the RF magnetic field generated from the whole body RF coil 4. For example, the RF shield 8 is formed by using metal such as copper foil, silver foil, a stainless-steel plate (which may be called a SUS mesh) to which mesh process has been applied, or the like.

Further, for example, as illustrated in the bottom section of FIG. 2, the whole body RF coil 4 is a birdcage coil and includes a supporting member 4a formed to have a substantially circular cylindrical shape, a pair of end rings 4b, and a plurality of rungs 4c. Further, the whole body RF coil 4 includes circuit elements 4d connected to the end rings 4b and circuit elements 4e connected to the rungs 4c.

The supporting member 4a is formed to have a substantially circular cylindrical shape and is configured to support the end rings 4b and the rungs 4c. The supporting member 4a may be referred to as a bobbin.

The end rings 4b are each an electrically-conductive member having a ring shape and being formed around the supporting member 4a, by using an electrically-conductive material. The end rings 4b are disposed near the two ends, in terms of the axial direction, of the supporting member 4a. For example, the end rings 4b are formed by using metal such as copper foil, silver foil, or the like.

The rungs 4c are each an electrically-conductive member formed to have an oblong rectangular shape by using an electrically-conductive material. The rungs 4c are provided to each extend across a gap formed between the end rings 4b and are positioned at intervals along the circumferential direction of the supporting member 4a. In this situation, the rungs 4c are provided on the outer circumferential surface of the supporting member 4a so as to extend along the axial direction of the supporting member 4a. When the RF magnetic field is generated, a radio frequency current flows through the rungs 4c. For example, the rungs 4c are formed by using metal such as copper foil, silver foil, or the like.

The circuit elements 4d connected to the end rings 4b and the circuit elements 4e connected to the rungs 4c are each provided on the outer circumferential surface of the supporting member 4a. In this situation, the circuit elements are predetermined circuit elements used for controlling operations of the whole body RF coil 4. For example, the circuit elements may each be a P-Intrinsic-N (PIN) Diode, a capacitor, or the like.

In this situation, for example, as illustrated in FIG. 2, while extending along the axial direction of the supporting member 4a, each of the rungs 4c is divided into two sections near the center (in the position indicated with the broken line A in FIG. 2) in terms of the longitudinal direction. Each of the circuit elements 4e is connecting the two divided sections together across the gap.

Figure 3:
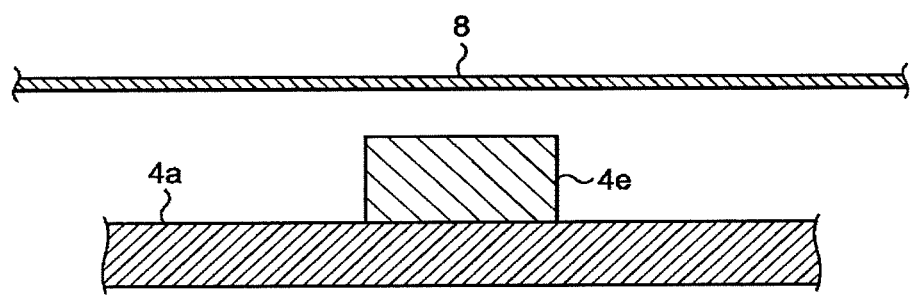
FIG. 3 is a cross-sectional view of a circuit element included in the whole body RF coil according to the embodiment.

FIG. 3 is a cross-sectional view of any of the circuit elements 4e included in the whole body RF coil 4 according to the present embodiment. FIG. 3 illustrates one of the circuit elements 4e connected to a rung 4c with a partial cross-sectional view of the whole body RF coil 4 in the position indicated with the broken line A in FIG. 2. FIG. 3 illustrates a cross-section orthogonal to the axial direction of the whole body RF coil 4.

For example, as illustrated in FIG. 3, the circuit element 4e connected to the rung 4c is provided on the outer circumferential surface of the supporting member 4a. In this situation, the circuit element 4e is fixed to the supporting member 4a, while being provided to extend across the gap formed between the divided sections of the rung 4c.

While the RF shield 8 is provided around the whole body RF coil 4 in this manner, it is known that, while a radio frequency current is flowing through the rungs 4c of the whole body RF coil 4, a mirror current occurs in the RF shield 8 in accordance therewith. Further, there is a possibility that the electric power required by the generation of the RF magnetic field may be increased by the mirror current.

Figure 4:
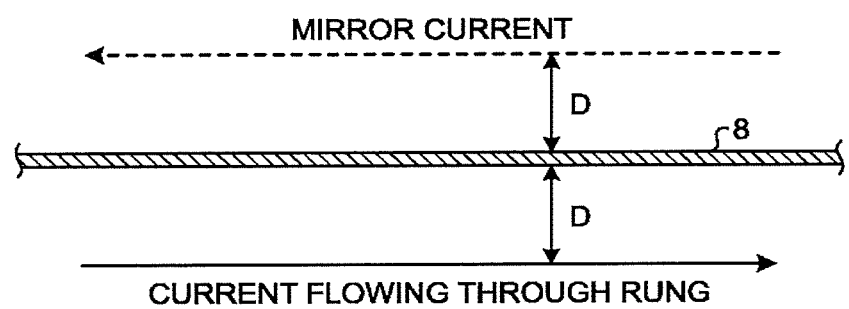
FIG. 4 is a drawing for explaining a mirror current related to the MRI apparatus according to the embodiment.

FIG. 4 is a drawing for explaining the mirror current related to the MRI apparatus 100 according to the present embodiment. FIG. 4 illustrates a partial cross-section of the RF shield 8 along the axial direction of the whole body RF coil 4.

For example, as illustrated in FIG. 4, when an image taking process is performed by the MRI apparatus 100, the radio frequency current flows through the rungs 4c, and the RF magnetic field generated thereby penetrates the RF shield 8. As a result, the mirror current apparently occurs in a position on the opposite side of the RF shield 8 at a distance (indicated as D in FIG. 4) equal to the distance from the radio frequency current to the RF shield 8. In this situation, the mirror current occurs so as to flow in the opposite direction from the direction of the current flowing through the rungs 4c. Due to the mirror current, a magnetic field cancelling out the RF magnetic field occurs. As a result, when the image taking process is performed, the electric power required by the generation of the RF magnetic field may be increased. Further, when the electric power used for generating the RF magnetic field is increased in this manner, because the amount of heat generated by the whole body RF coil 4 increases, there is a possibility that the temperature of the image taking space in which the subject S is placed may rise, and the Signal Noise Ratio (SNR) of images may be lowered.

For these reasons, the MRI apparatus 100 according to the present embodiment is configured to be able to reduce the electric power required by the generation of the RF magnetic field. More specifically, according to the present embodiment, at least a part of each of the rungs 4c included in the whole body RF coil 4 is arranged to be positioned more inward than the outer circumferential surface of the supporting member 4a in terms of the radial direction of the supporting member 4a.

Figure 5:
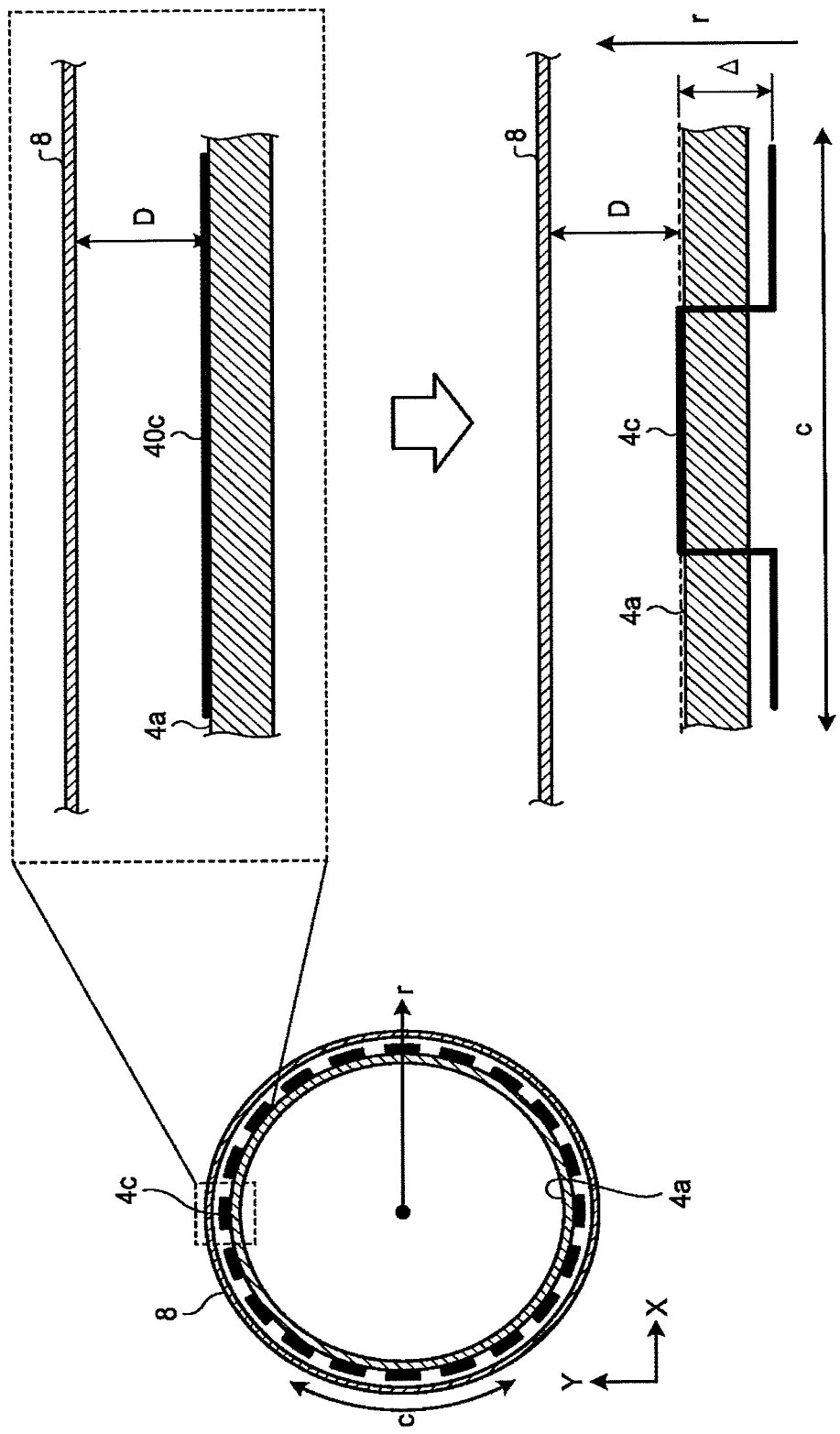
FIG. 5 is a cross-sectional view illustrating configurations of the whole body RF coil and a rung according to the embodiment.

FIG. 5 is a cross-sectional view of the whole body RF coil 4 and the rungs 4c according to the present embodiment. The left section of FIG. 5 illustrates a cross-section of the whole body RF coil 4 taken at the position indicated by the broken line B in FIG. 2. The top right section of FIG. 5 illustrates a cross-section of a rung 40c according to a comparison example for the present embodiment. The bottom right section of FIG. 5 illustrates a cross-section of a rung 4c according to the present embodiment. In this situation, FIG. 5 illustrates the cross-sections orthogonal to the axial direction of the whole body RF coil 4. Accordingly, the electric current flows through the rung 4c in a direction orthogonal to the cross-section illustrated in FIG. 5.

For example, as illustrated in the bottom right section of FIG. 5, in the present embodiment, the two end parts of the rung 4c in terms of the circumferential directions (the directions indicated by the arrow c in FIG. 5) of the supporting member 4a are arranged to be positioned inwardly away from the outer circumferential surface of the supporting member 4a by a predetermined distance (Δ in FIG. 5) in terms of the radial direction (the direction indicated by the arrow r in FIG. 5) of the supporting member 4a. Although FIG. 5 illustrates one of the plurality of rungs 4c included in the whole body RF coil 4, each of all the rungs 4c has the same configuration in the present embodiment.

In other words, each of the rungs 4c includes a first part provided on the outer circumferential surface of the supporting member 4a and a second part positioned farther away from the RF shield 8 provided on the outer circumferential side of the whole body RF coil 4 than the first part is, in terms of the radial direction of the supporting member 4a.

That is to say, each of the rungs 4c includes the first part provided on the outer circumferential surface of the supporting member 4a and the second part positioned closer to the central axis of the supporting member 4a than the first part is, in terms of the radial direction of the supporting member 4a.

In this situation, for example, the rungs 4c are each configured in such a manner that at least a part of the second part is embedded in the supporting member 4a.

With this configuration, for example, the rungs 4c are partially positioned farther away from the RF shield 8, in comparison to the situation where the entirety of each of the rungs 40c is provided on the outer circumferential surface of the supporting member 4a as illustrated in the top right section of FIG. 5. In this regard, the magnitude of a magnetic field generated by an electric current is usually inversely proportional to the distance thereof from the position where the electric current is flowing. Accordingly, by arranging the rungs 4c to be partially positioned farther away from the RF shield 8 as described above, it is possible to decrease the magnitude of the RF magnetic field penetrating the RF shield 8. It is therefore possible to reduce the mirror current. Consequently, according to the present embodiment, it is possible to reduce the magnetic field that is generated by the mirror current and that cancels out the RF magnetic field. It is therefore possible to reduce the electric power required by the generation of the RF magnetic field.

Figure 6:
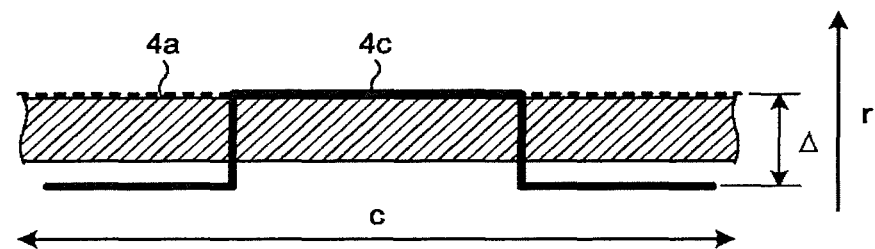
FIG. 6 is a cross-sectional view illustrating an example of the shape of the rung according to the embodiment.

FIG. 6 is a cross-sectional view illustrating an example of the shape of any of the rungs 4c according to the present embodiment. In FIG. 6, the up-and-down direction corresponds to the radial direction (the direction indicated by the arrow r in FIG. 5) of the supporting member 4a. In FIG. 6, the left-and-right directions correspond to the circumferential directions (the directions indicated by the arrow c in FIG. 5) of the supporting member 4a and to the shorter-side direction (hereinafter, "the width direction") of the rung 4c.

For example, as illustrated in FIG. 6, the rung 4c is formed so that a central part thereof in terms of the width direction protrudes from two end parts positioned on either side of the central part and so that connecting parts each of which connects the central part to a different one of the two end parts are each substantially orthogonal to the width direction of the rung 4c. Further, in the present example, the rung 4c is fixed to the supporting member 4a, in such a manner that the central part in terms of the width direction is provided on the outer circumferential surface of the supporting member 4a while the two end parts thereof are positioned on the inner circumferential side of the supporting member 4a. In other words, in the present example, the two end parts of the rung 4c are provided on the surface of the supporting member 4a on the opposite side from the surface on which the circuit elements 4e are provided.

In the example illustrated in FIG. 6, the two end parts of the rung 4c are positioned away from the inner circumferential surface of the supporting member 4a. However, possible configurations of the rung 4c according to the present example are not limited to the configuration in the illustrated example. For instance, the two end parts of the rung 4c may be provided on the inner circumferential surface of the supporting member 4a or may be embedded on the inside of the supporting member 4a. In other words, in the present example, it is possible to achieve the advantageous effect of reducing the mirror current as long as the two end parts of the rung 4c are positioned more inward, even by a little, than the outer circumferential surface of the supporting member 4a.

Further, possible shapes of the rung 4c are not limited to the example illustrated in FIG. 6.

FIGS. 7 to 12 are cross-sectional views of other examples of the shape of the rung 4c according to the present embodiment. In FIGS. 7 to 12, the up-and-down direction corresponds to the radial direction (the direction indicated by the arrow r in FIG. 5) of the supporting member 4a. In FIGS. 7 to 12, the left-and-right directions correspond to the circumferential directions (the directions indicated by the arrow c in FIG. 5) of the supporting member 4a and to the width direction of the rung 4c.

Figure 7:
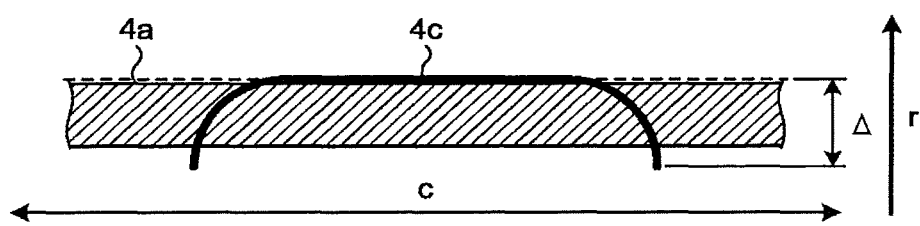
FIG. 7 is a cross-sectional view illustrating another example of the shape of the rung according to the embodiment.

For example, as illustrated in FIG. 7, the rung 4c may be formed in such a manner that the two end parts in terms of the width direction are bent toward the mutually the same side. Further, in the present example, the rung 4c is fixed to the supporting member 4a in such a manner that the central part in terms of the width direction is provided on the outer circumferential surface of the supporting member 4a, while the two end parts thereof are embedded on the inside of the supporting member 4a.

Further, in the example illustrated in FIG. 7, the tip end of each of the two end parts of the rung 4c protrudes from the inner circumferential surface of the supporting member 4a; however, possible configurations of the rung 4c according to the present example are not limited the configuration in the illustrated example. For instance, the tip end of each of the two end parts of the rung 4c does not necessarily have to protrude from the inner circumferential surface of the supporting member 4a and may be embedded on the inside of the supporting member 4a. In other words, in the present example, it is possible to achieve the advantageous effect of reducing the mirror current as long as the two end parts of the rung 4c are positioned more inward, even by a little, than the outer circumferential surface of the supporting member 4a.

Figure 8:
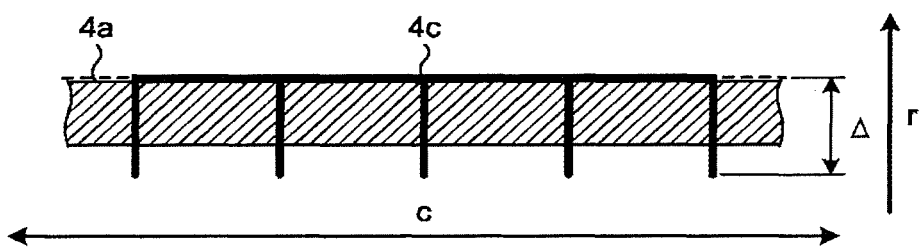
FIG. 8 is a cross-sectional view illustrating yet another example of the shape of the rung according to the embodiment.

Further, for example, as illustrated in FIG. 8, the rung 4c may be formed to have a plurality of projections protruding on mutually the same side in such a manner that a cross-section taken along the width direction exhibits a comb-like formation. Further, in the present example, the rung 4c is fixed to the supporting member 4a so as to be provided on the outer circumferential surface of the supporting member 4a over the entirety of the width direction and so that the protrusions are positioned on the inside of the supporting member 4a.

Further, in the example illustrated in FIG. 8, the tip end of each of the protrusions of the rung 4c protrudes from the inner circumferential surface of the supporting member 4a; however, possible configurations of the rung 4c according to the present example are not limited to the configuration in the illustrated example. For instance, the tip end of each of the protrusions of the rung 4c does not necessarily have to protrude from the inner circumferential surface of the supporting member 4a and may be embedded on the inside of the supporting member 4a. In other words, in the present example, it is possible to achieve the advantageous effect of reducing the mirror current as long as the protrusions of the rung 4c are positioned more inward, even by a little, than the outer circumferential surface of the supporting member 4a.

Figure 9:
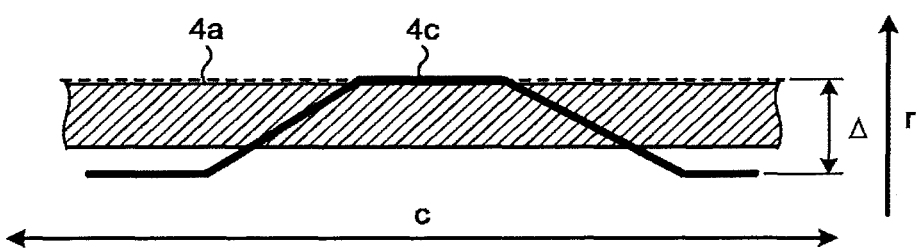
FIG. 9 is a cross-sectional view illustrating yet another example of the shape of the rung according to the embodiment.

Further, for example, as illustrated in FIG. 9, the rung 4c may be formed so that a central part thereof in terms of the width direction protrudes from two end parts positioned on either side of the central part and so that connecting parts each of which connects the central part to a different one of the two end parts are each slanted with respect to the width direction of the rung 4c. Further, in the present example, similarly to the example illustrated in FIG. 6, the rung 4c is fixed to the supporting member 4a, in such a manner that the central part in terms of the width direction is provided on the outer circumferential surface of the supporting member 4a, while the two end parts thereof are positioned on the inner circumferential side of the supporting member 4a. In other words, in the present example, the two end parts of the rung 4c are provided on the surface of the supporting member 4a on the opposite side from the surface on which the circuit elements 4e are provided.

Further, in the example illustrated in FIG. 9, the two end parts of the rung 4c are positioned away from the inner circumferential surface of the supporting member 4a. However, possible configurations of the rung 4c according to the present example are not limited to the configuration in the illustrated example. For instance, the two end parts of the rung 4c may be provided on the inner circumferential surface of the supporting member 4a or may be embedded on the inside of the supporting member 4a. In other words, in the present example also, it is possible to achieve the advantageous effect of reducing the mirror current as long as the two end parts of the rung 4c are positioned more inward, even by a little, than the outer circumferential surface of the supporting member 4a.

Figure 10:
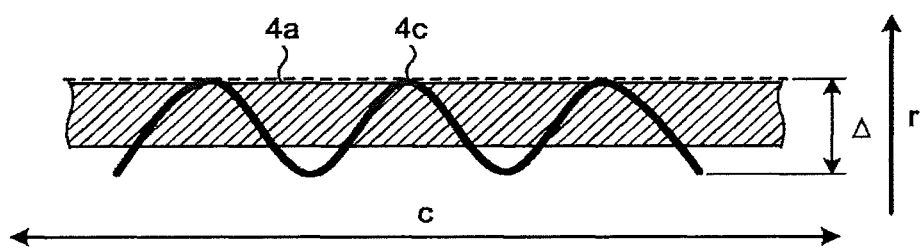
FIG. 10 is a cross-sectional view illustrating yet another example of the shape of the rung according to the embodiment.

Further, for example, as illustrated in FIG. 10, the rung 4c may be formed so as to undulate up and down in the directions orthogonal to the width direction in such a manner that a cross-section taken along the width direction exhibits a wave-like formation. Further, in the present example, the rung 4c is fixed to the supporting member 4a, in such a manner that the two end parts thereof are positioned on the inner circumferential side of the supporting member 4a, while the undulating curved parts between the two end parts are positioned alternately on the outer circumferential surface of the supporting member 4a and on the inner circumferential side of the supporting member 4a.

Further, in the example illustrated in FIG. 10, the tip end of each of two end parts of the rung 4c and the undulating curved parts positioned on the inner circumferential side of the supporting member 4a each protrude from the inner circumferential surface of the supporting member 4a. However, possible configurations of the rung 4c according to the present example are not limited to the configuration in the illustrated example. For instance, the tip end of each of the two end parts of the rung 4c and the undulating curved parts positioned on the inner circumferential side of the supporting member 4a do not necessarily have to protrude from the inner circumferential surface of the supporting member 4a and may be embedded on the inside of the supporting member 4a. In other words, in the present example, it is possible to achieve the advantageous effect of reducing the mirror current as long as the two end parts of the rung 4c and the undulating curved parts positioned on the inner circumferential side of the supporting member 4a are positioned more inward, even by a little, than the outer circumferential surface of the supporting member 4a.

Figure 11:
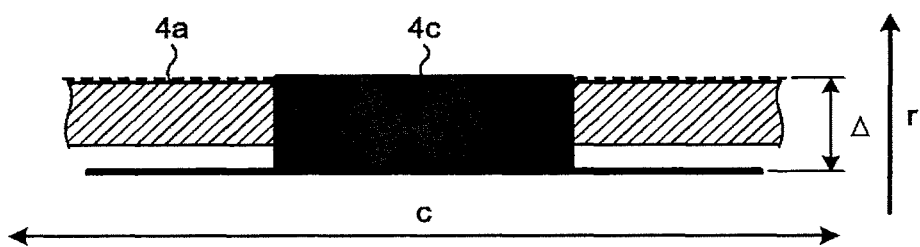
FIG. 11 is a cross-sectional view illustrating yet another example of the shape of the rung according to the embodiment.

Further, for example, as illustrated in FIG. 11, the rung 4c may be formed in such a manner that a central part in terms of the width direction is thicker than the thickness of the supporting member 4a, while protruding from the two end parts positioned on either side of the central part. Further, in the present example, the rung 4c is fixed to the supporting member 4a in such a manner that one of the surfaces of the central part in terms of the width direction is provided on the outer circumferential surface of the supporting member 4a while the other surface of the central part and the two end parts in terms of the width direction are positioned on the inner circumferential side of the supporting member 4a. In other words, in the present example, the two end parts of the rung 4c are provided on the surface of the supporting member 4a on the opposite side from the surface on which the circuit elements 4e are provided. In the present example, because the central part of the rung 4c in terms of the width direction is formed to be thicker, it is possible to release the heat generated by the circuit elements 4e more efficiently.

In the example illustrated in FIG. 11, the two end parts of the rung 4c are positioned away from the inner circumferential surface of the supporting member 4a. However, possible configurations of the rung 4c according to the present example are not limited to the configuration in the illustrated example. For instance, the two end parts of the rung 4c may be provided on the inner circumferential surface of the supporting member 4a or may be embedded on the inside of the supporting member 4a. In other words, in the present example, it is possible to achieve the advantageous effect of reducing the mirror current as long as the two end parts of the rung 4c are positioned more inward, even by a little, than the outer circumferential surface of the supporting member 4a.

In the examples illustrated in FIGS. 6 to 11, at least a part of the second part of the rung 4c is embedded in the supporting member 4a; however, possible embodiments are not limited to these examples. For instance, another arrangement is acceptable in which at least a part of the second part of the rung 4c is positioned in a groove formed on the outer circumferential surface of the supporting member 4a.

Figure 12:
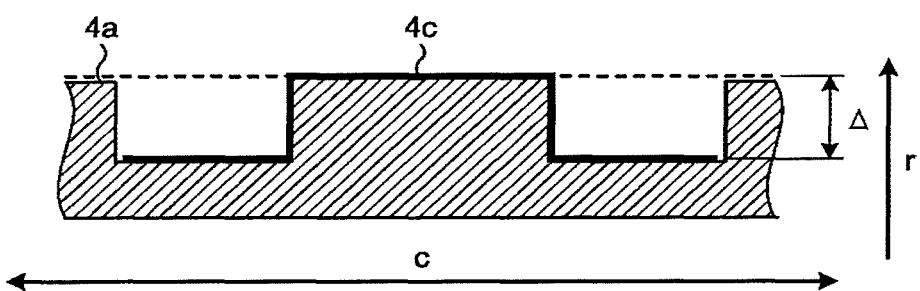
FIG. 12 is a cross-sectional view illustrating yet another example of the shape of the rung according to the embodiment.

For example, as illustrated in FIG. 12, the rung 4c may be configured in such a manner that a central part in terms of the width direction is provided on the outer circumferential surface of the supporting member 4a, while the two end parts positioned on either side of the central part are each positioned on the bottom face of a corresponding one of grooves formed on the outer circumferential surface of the supporting member 4a. In the example illustrated in FIG. 12, each of the grooves in the supporting member 4a is formed so as to extend along the axial direction of the supporting member 4a, while having a predetermined depth (indicated as A in FIG. 12) from the outer circumferential surface of the supporting member 4a in the radial direction of the supporting member 4a.

In each of the examples illustrated in FIGS. 6 to 12, the end parts of the rung 4c are positioned more inward than the outer circumferential surface of the supporting member 4a.

In this situation, when an electric current flows through an electrically-conductive member such as the rung 4c, the current density is usually higher in the end parts of the electrically-conductive member. Accordingly, by arranging the end parts of the rung 4c to be positioned more inward than the outer circumferential surface of the supporting member 4a as illustrated in FIGS. 6 to 12, it is possible to further decrease the magnitude of the RF magnetic field penetrating the RF shield 8. It is therefore possible to further reduce the mirror current.

Further, in each of the rungs 4c illustrated in FIGS. 6 to 12, it is desirable to keep the dimension of the part provided on the outer circumferential surface of the supporting member 4a as small as possible. With this arrangement, it is possible to decrease the magnitude of the RF magnetic field penetrating the RF shield 8 and to enhance the advantageous effect of reducing the mirror current. For example, it is desirable to arrange the dimension of the central part of the rung 4c to be as large as possible, while ensuring at least that it is possible to position the circuit elements 4e.

Further, in each of the rungs 4c illustrated in FIGS. 6 to 12, it is desirable to keep the distance (indicated as Δ in FIGS. 6 to 12) as long as possible between the part positioned more inward than the outer circumferential surface of the supporting member 4a and the outer circumferential surface of the supporting member 4a. With this arrangement, it is possible to arrange a part of the rung 4c to be positioned farther away from the RF shield 8 and to enhance the advantageous effect of reducing the mirror current. For example, it is desirable to arrange the distance as long as possible between the part positioned more inward than the outer circumferential surface of the supporting member 4a and the outer circumferential surface of the supporting member 4a, while ensuring that the bore B has a sufficient diameter required by the MRI apparatus 100.

As explained above, according to the present embodiment, in the whole body RF coil 4, at least a part of the rung 4c is positioned more inward than the outer circumferential surface of the supporting member 4a in terms of the radial direction of the supporting member 4a. With this arrangement, according to the present embodiment, it is possible to decrease the magnitude of the RF magnetic field penetrating the RF Shield 8 and to reduce the mirror current. Consequently, according to the present embodiment, it is possible to decrease the magnetic field that is generated by the mirror current and that cancels out the RF magnetic field and to reduce the electric power required by the generation of the RF magnetic field.

OTHER EMBODIMENTS

In the embodiments described above, the examples are explained in which all the rungs 4c included in the whole body RF coil 4 are configured in the same manner as one another; however, possible embodiments are not limited to these examples. For instance, it is acceptable to configure only one or more of the plurality of rungs 4c included in the whole body RF coil 4 to have the configuration described in the above embodiment.

For example, in the embodiments described above, the whole body RF coil 4 may be formed so that the shape of a cross-section orthogonal to the central axis thereof is a perfect circle, while the RF shield 8 is formed so that the shape of a cross-section orthogonal to the central axis is oval. In that situation, among the plurality of rungs 4c included in the whole body RF coil 4, only one of the rungs 4c that is positioned closest to the RF shield 8 or only the rung 4c positioned closest to the RF shield 8 and certain rungs 4c positioned in the surroundings thereof shall be configured to have the same shape as that of the rung 4c described in the embodiments above. In this situation, the rung 4c positioned closest to the RF shield 8 is the rung 4c positioned on the major axis of the whole body RF coil 4 (the major axis of the oval) or near the major axis.

Further, in the embodiments described above, the examples are explained in which the whole body RF coil 4 is a birdcage coil; however, possible embodiments are not limited to these examples. For instance, the whole body RF coil 4 may be a coil having a different shape.

For example, the whole body RF coil 4 may be a Transverse Electromagnetic (TEM) coil. Generally speaking, in TEM coils, in a plurality of positions along the circumferential direction of a supporting member formed to have a circular cylindrical shape, electrically-conductive members each extending in the axial direction are provided in a two-fold manner in the radial direction. For this reason, when the whole body RF coil 4 is a TEM coil, for example, of the electrically-conductive members provided in the two-fold manner in the radial direction, the electrically-conductive member positioned on the inner side shall be configured to have the same shape as that of the rung 4c described in the embodiment above. With this arrangement, it is possible to reduce the mirror current occurring in the electrically-conductive member provided on the outer side due to an influence of the RF magnetic field generated by the electrically-conductive member provided on the inner side.

Further, for example, the whole body RF coil 4 may be a saddle-shaped coil, a solenoid coil, a slot resonator coil, or the like.

Further, in the embodiments described above, the example is explained in which the MRI apparatus 100 has a so-called tunnel-like structure where the magnet 1, the gradient coil 2, and the whole body RF coil 4 are each formed to have a substantially circular cylindrical shape; however, possible embodiments are not limited to this example. For instance, the MRI apparatus 100 may have a so-called open structure where a pair of magnets, a pair of gradient coils, and a pair of RF coils are arranged to face each other while the image taking space in which the subject S is placed is interposed therebetween.

In either of these examples, it is sufficient when the RF coil is configured in such a manner that at least a part of the electrically-conductive member provided on the surface of the supporting member is positioned more inward than the surface of the supporting member in the thickness direction of the supporting member. With this arrangement, when an electrically-conductive member such as the RF shield is provided in a position facing the surface of the supporting member on which the electrically-conductive member is provided, it is possible to reduce the mirror current occurring in the electrically-conductive member due to the RF magnetic field.

The term "processor" used in the explanations of the above embodiments denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). In this situation, instead of saving the programs in a storage, it is also acceptable to directly incorporate the programs in the circuits of the processors. In that situation, the processors realize the functions thereof by reading and executing the programs incorporated in the circuits thereof. Further, the processors in the present embodiments do not each necessarily have to be structured as a single circuit. It is also acceptable to structure one processor by combining together a plurality of independent circuits so as to realize the functions thereof.

In this situation, the programs executed by the one or more processors are provided as being incorporated, in advance, in a Read-Only Memory (ROM), a storage, or the like. Alternatively, the programs may be provided as being recorded on a computer-readable storage medium such as a Compact Disk Read-Only Memory (CD-ROM), a Flexible Disk (FD), a Compact Disk Recordable (CD-R), a Digital Versatile Disk (DVD), or the like, in a file in such a format that is either installable or executable for the devices. Further, the programs may be stored in a computer connected to a network such as the Internet, so as to be provided or distributed as being downloaded via the network. For example, each of the programs is structured with a module including the functions described above. In the actual hardware, as a result of a CPU reading and executing the programs from a storage medium such as a ROM, the modules are loaded into a main storage device so as to be generated in the main storage device.

According to at least one aspect of the embodiments described above, it is possible to provide the magnetic resonance imaging apparatus and the RF coil capable of reducing the electric power required by the generation of the RF magnetic field.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising: a Radio Frequency (RF) coil arranged on an inside of a gradient coil and configured to apply an RF magnetic field to a subject, wherein
the RF coil includes:
a supporting member formed to have a circular cylindrical shape; and
a plurality of rungs which are positioned at intervals along a circumferential direction of the supporting member and through which a radio frequency current flows when the RF magnetic field is generated, each of the plurality of rungs being formed to have an oblong rectangular shape and arranged to extend along an axial direction of the supporting member, wherein
at least one of the plurality of rungs includes a first part and a second part within the oblong rectangular shape, wherein
the first part is provided on an outer circumferential surface of the supporting member; and
the second part is positioned farther away from an RF shield than the first part is, in terms of a radial direction of the supporting member, the RF shield being provided on an outer circumferential side of the RF coil and configured to block the RF magnetic field generated by the RF coil.

2. The magnetic resonance imaging apparatus according to claim 1, wherein the at least one of the plurality of rungs is configured in such a manner that at least a part of the second part is embedded in the supporting member.

3. The magnetic resonance imaging apparatus according to claim 1, wherein
the RF coil is a birdcage coil including a pair of end rings provided near two ends, in terms of the axial direction, of the supporting member and the plurality of rungs that are provided to each extend across a gap formed between the end rings and are positioned at intervals along the circumferential direction of the supporting member.

4. The magnetic resonance imaging apparatus according to claim 1, wherein the RF coil further includes a circuit element that is provided on the outer circumferential surface of the supporting member and is connected to the at least one of the plurality of rungs.

5. The magnetic resonance imaging apparatus according to claim 1, wherein the at least one of the plurality of rungs is configured in such a manner that at least a part of the second part is positioned on an inner circumferential side of the supporting member.

6. The magnetic resonance imaging apparatus according to claim 5, wherein the at least one of the plurality of rungs is configured in such a manner that an end part of the second part is positioned on the inner circumferential side of the supporting member.

7. A magnetic resonance imaging apparatus comprising: a Radio Frequency (RF) coil arranged on an inside of a gradient coil and configured to apply an RF magnetic field to a subject, wherein
the RF coil includes:
a supporting member formed to have a circular cylindrical shape; and
a plurality of rungs which are positioned at intervals along a circumferential direction of the supporting member and through which a radio frequency current flows when the RF magnetic field is generated, each of the plurality of rungs being formed to have an oblong rectangular shape and arranged to extend along an axial direction of the supporting member, wherein
at least one of the plurality of rungs includes a first part and a second part within the oblong rectangular shape, wherein
the first part is provided on an outer circumferential surface of the supporting member; and
the second part is positioned closer to a central axis of the supporting member than the first part is, in terms of a radial direction of the supporting member.

8. The magnetic resonance imaging apparatus according to claim 7, wherein the at least one of the plurality of rungs is configured in such a manner that at least a part of the second part is embedded in the supporting member.

9. The magnetic resonance imaging apparatus according to claim 7, wherein
the RF coil is a birdcage coil including a pair of end rings provided near two ends, in terms of the axial direction, of the supporting member and the plurality of rungs that are provided to each extend across a gap formed between the end rings and are positioned at intervals along the circumferential direction of the supporting member.

10. The magnetic resonance imaging apparatus according to claim 7, wherein the RF coil further includes a circuit element that is provided on the outer circumferential surface of the supporting member and is connected to the at least one of the plurality of rungs.

11. The magnetic resonance imaging apparatus according to claim 7, wherein the at least one of the plurality of rungs is configured in such a manner that at least a part of the second part is positioned on an inner circumferential side of the supporting member.

12. The magnetic resonance imaging apparatus according to claim 11, wherein the at least one of the plurality of rungs is configured in such a manner that an end part of the second part is positioned on the inner circumferential side of the supporting member.

13. An RF coil included in a magnetic resonance imaging apparatus, arranged on an inside of a gradient coil and configured to apply an RF magnetic field to a subject, the RF coil comprising:
    a supporting member formed to have a circular cylindrical shape; and
    a plurality of rungs which are positioned at intervals along a circumferential direction of the supporting member and through which a radio frequency current flows when the RF magnetic field is generated, each of the plurality of rungs being formed to have an oblong rectangular shape and arranged to extend along an axial direction of the supporting member, wherein
at least one of the plurality of rungs includes a first part and a second part within the oblong rectangular shape, wherein
    the first part is provided on an outer circumferential surface of the supporting member; and
    the second part is positioned farther away from an RF shield than the first part is, in terms of a radial direction of the supporting member, the RF shield being provided on an outer circumferential side of the RF coil and configured to block the RF magnetic field generated by the RF coil.

\* \* \* \* \*